US012388450B2

(12) United States Patent
Lu et al.

(10) Patent No.: US 12,388,450 B2
(45) Date of Patent: Aug. 12, 2025

(54) ELECTRONIC OSCILLATOR CIRCUIT AND A METHOD FOR CONTROLLING AN OSCILLATION FREQUENCY OF A RING OSCILLATOR CIRCUIT

(71) Applicant: Logistics and Supply Chain MultiTech R&D Centre Limited, Pok Fu Lam (HK)

(72) Inventors: Feng Lu, Pok Fu Lam (HK); Jing Jung Tang, Pok Fu Lam (HK)

(73) Assignee: Logistics and Supply Chain MultiTech R&D Centre Limited, Pok Fu Lam (HK)

( * ) Notice: Subject to any disclaimer, the term of this patent is extended or adjusted under 35 U.S.C. 154(b) by 0 days.

(21) Appl. No.: 18/475,485

(22) Filed: Sep. 27, 2023

(65) Prior Publication Data

US 2025/0105849 A1    Mar. 27, 2025

(51) Int. Cl.
*H03L 7/099* (2006.01)
*H03K 3/03* (2006.01)
*H03L 7/089* (2006.01)
*H03L 7/14* (2006.01)

(52) U.S. Cl.
CPC ......... *H03L 7/0998* (2013.01); *H03K 3/0315* (2013.01); *H03L 7/0891* (2013.01); *H03L 7/145* (2013.01)

(58) Field of Classification Search
CPC .................................................. H03K 3/0315
See application file for complete search history.

(56) References Cited

U.S. PATENT DOCUMENTS

| | | | | |
|---|---|---|---|---|
| 6,310,523 | B1 * | 10/2001 | Chen .................... | H03K 3/0315 331/177 R |
| 2004/0070459 | A1 * | 4/2004 | Motoyama ........... | H03K 3/0315 331/57 |
| 2011/0006851 | A1 * | 1/2011 | Kim ....................... | H03K 5/133 331/57 |
| 2015/0171838 | A1 * | 6/2015 | Tsai ....................... | H03K 3/0315 331/57 |
| 2021/0058075 | A1 * | 2/2021 | Shah .................... | H03K 5/1515 |

* cited by examiner

*Primary Examiner* — Ryan Johnson
(74) *Attorney, Agent, or Firm* — Renner, Kenner, Greive, Bobak, Taylor & Weber

(57) ABSTRACT

An electronic oscillator circuit and a method for controlling an oscillation frequency of a ring oscillator circuit. The circuit includes a plurality of inverter stages each Including an inverter and a trans-resistance switch circuit configured to switch on the inverter during an operation of the electronic oscillator circuit thereby facilitating the inverter to generate an inverter output signal in response to an inverter input signal fed to the inverter; wherein the inverters in the plurality of the inverter stages are connected to form a ring oscillator circuit.

14 Claims, 5 Drawing Sheets

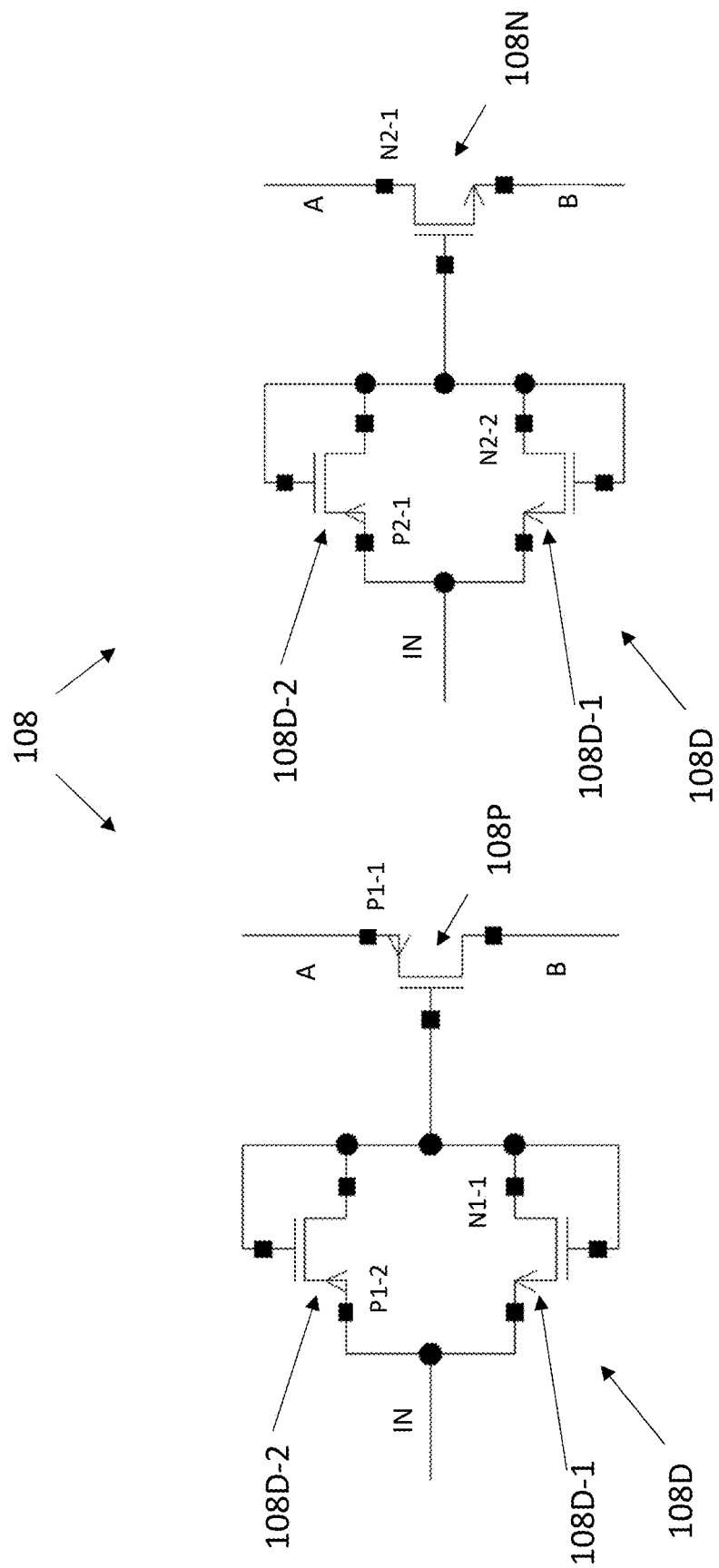

ELECTRONIC OSCILLATOR CIRCUIT AND A METHOD FOR CONTROLLING AN OSCILLATION FREQUENCY OF A RING OSCILLATOR CIRCUIT

TECHNICAL FIELD

The present invention relates to an electronic oscillator circuit and a method for controlling an oscillation frequency of a ring oscillator circuit, although not exclusively, to low-power ring oscillator circuit.

BACKGROUND

Oscillators or oscillator circuits are important components in electronic devices. One of the primary applications of oscillators is clock generation, which may be used to generate clock signals for logic circuits, microcontrollers, and embedded devices. Another important application of oscillator is frequency synthesis, where oscillator circuits may be used to generate high-frequency signals, which may be particularly valuable in wireless communication systems where high-frequency signals are required.

Oscillator circuit may be employed in various applications, and some of the applications may require low power consumption. For example, these applications may include battery-powered devices, IoT devices, and wearable electronics. The use of low power oscillator circuits may offer significant advantages in terms of energy efficiency and power optimization.

The low power consumption of oscillator may be suitable for battery-powered devices where power efficiency is crucial. For example, by using low power oscillator for clock generation, the overall power consumption of the device can be minimized, thereby extending the battery life. In frequency synthesis applications, power consumption should be kept to a minimum.

SUMMARY OF THE INVENTION

In accordance with a first aspect of the invention, there is provided an electronic oscillator circuit comprising: a plurality of inverter stages each comprises an inverter and a trans-resistance switch circuit configured to switch on the inverter during an operation of the electronic oscillator circuit thereby facilitating the inverter to generate an inverter output signal in response to an inverter input signal fed to the inverter; wherein the inverters in the plurality of the inverter stages are connected to form a ring oscillator circuit.

In accordance with the first aspect, the trans-resistance switch circuit comprises at least one pair of trans-resistance switches arranged to respectively connect the inverter in the same inverter stage to a VDD node and a VSS node of the electronic oscillator circuit.

In accordance with the first aspect, the inverter in each of the inverter stage is switched on only when the inverter is electrically connected to the VDD node and the VSS node via a complete circuit path formed by the trans-resistance switch circuit.

In accordance with the first aspect, the trans-resistance switch circuit comprises a plurality of pairs of cascaded trans-resistance switches, including a first set of trans-resistance switches connected in series between the inverter and the VDD node, and a second set of trans-resistance switches connected in series between the inverter and the VSS node.

In accordance with the first aspect, each of the at least one pair of trans-resistance switches comprises a P-channel transistor arranged to connect the inverter to the VDD node and an N-channel transistor arranged to connected the inverter to the VSS node. In accordance with the first aspect, each of the P-channel transistor and the N-channel transistor are controlled by a trans-resistance switch input signal via a diode circuit. In accordance with the first aspect, the diode circuit comprises a first switch and a second switch connected in parallel, wherein the each of the first switch and the second switch includes a diode connected transistor or a diode.

In accordance with the first aspect, each of the P-channel transistor and the N-channel transistor share a common trans-resistance switch input signal via the diode circuit. In accordance with the first aspect, the circuit further comprises a multiplexer arranged to output a control signal for each of the first set of trans-resistance switches and the second set of trans-resistance switches corresponding to the inverter output signal at each plurality of inverter stages being provided to the multiplexer as multiplexer input signals.

In accordance with the first aspect, the multiplexer is a multiple-in-multiple-out multiplexer.

In accordance with the first aspect, the control signal is generated further based on a group of control word being inputted to the multiple-in-multiple-out multiplexer.

In accordance with the first aspect, an oscillator frequency of the ring oscillator is tuned by modifying the group of control word.

In accordance with the first aspect, the multiplexer is arranged forward the inverter output signal of a predetermined stage in the ring oscillator circuit to control a plurality pairs of cascaded trans-resistance switches in one or more previous inverter stages in the ring oscillator circuit.

In accordance with the first aspect, the inverter output signal of each of a plurality of inverter stages are provided as a control signal for each of the first set of trans-resistance switches and the second set of trans-resistance switches in one or more of previous stages in the ring oscillator circuit.

In accordance with the first aspect, the control signal is provided to pairs of trans-resistance switches in a number of previous stages matching with the number of pairs of trans-resistance switches in each inverter stage.

In accordance with a second aspect of the invention, there is provided a method for controlling an oscillation frequency of a ring oscillator circuit, comprising the step of: providing a plurality of inverter stages each comprises an inverter and a trans-resistance switch circuit configured to switch on the inverter during an operation of the ring oscillator circuit; and facilitating the inverter to generate an inverter output signal in response to an inverter input signal fed to the inverter.

In accordance with the second aspect, the trans-resistance switch circuit comprises at least one pair of trans-resistance switches arranged to respectively connect the inverter in the same inverter stage to a VDD node and a VSS node of the ring oscillator circuit.

In accordance with the second aspect, the inverter in each of the inverter stage is switched on only when the inverter is electrically connected to the VDD node and the VSS node via a complete circuit path formed by the trans-resistance switch circuit.

In accordance with the second aspect, the trans-resistance switch circuit comprises a plurality of pairs of cascaded trans-resistance switches, including a first set of trans-resistance switches connected in series between the inverter and the VDD node, and a second set of trans-resistance switches connected in series between the inverter and the VSS node.

In accordance with the second aspect, the method further comprises the step of providing a multiplexer arranged to output a control signal for each of the first set of trans-resistance switches and the second set of trans-resistance switches corresponding to the inverter output signal at each plurality of inverter stages being provided to the multiplexer as multiplexer input signals.

BRIEF DESCRIPTION OF THE DRAWINGS

Embodiments of the present invention will now be described, by way of example, with reference to the accompanying drawings in which:

FIG. 2 is a schematic diagram showing a trans-resistance switch in an inverter stage of the electronic oscillator circuit in accordance with an embodiment of the present invention;

FIG. 3 is a schematic diagram showing a trans-resistance switch in an inverter stage of the electronic oscillator circuit in accordance with an alternative embodiment of the present invention;

DETAILED DESCRIPTION OF THE PREFERRED EMBODIMENTS

Figure 1:
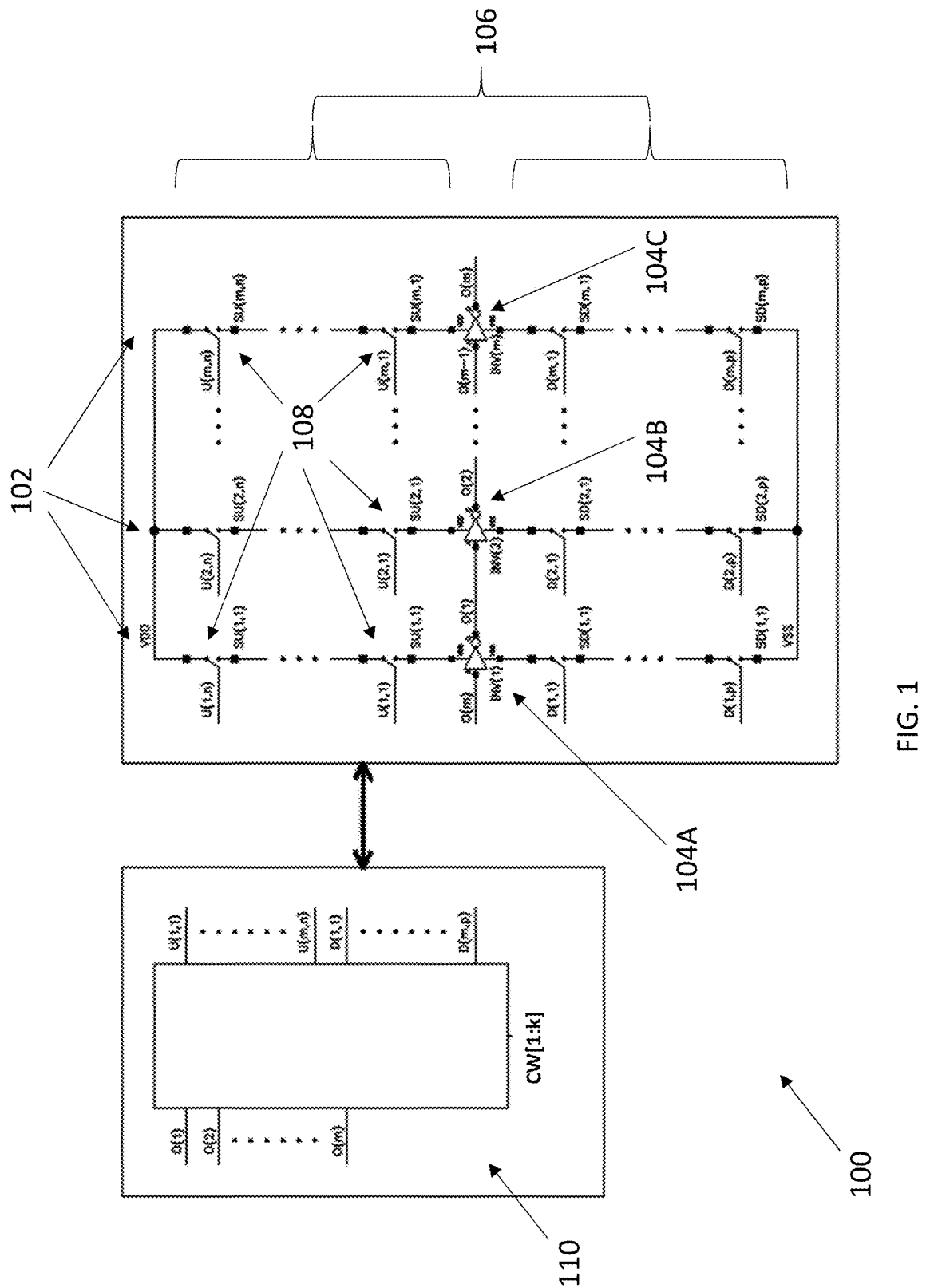
FIG. 1 is a schematic diagram showing an electronic oscillator circuit in accordance with an embodiment of the present invention.

The inventors devised that low power oscillator may also play a crucial role in sensor applications. For example, oscillators may be utilized to generate the clock signals required for signal processing in sensors, in which power consumption is preferably minimized to prolong the battery life. This may be particularly important in applications where sensors are deployed in remote or inaccessible locations, where battery replacement or recharging is not feasible.

In an alternative example, in signal processing circuits or applications, oscillators are responsible for generating clock signals for analogue-to-digital converters (ADCs) and digital signal processors (DSPs). In this example, minimizing power consumption is crucial to reduce the heat generated by the circuit. Thus, oscillators may be designed to meet the power requirements of signal processing circuits while ensuring efficient operation and minimizing heat dissipation.

Without wishing to be bound by theory, low power ring oscillators (RO) may be employed due to their enhanced performance and reduced power consumption. Several electronic device fabrication technologies have been employed in low power RO technology, for example, FinFET technology, a type of 3D transistor technology, may be used to enhance the performance of ROs. This technology reduces leakage current, improves gate control, and allows for better power management. By implementing FinFET technology, low power ROs can achieve higher efficiency and improved overall performance.

Fully depleted silicon-on-insulator (FD-SOI) technology is another advanced transistor technology that is well-suited for low power ROs. FD-SOI technology reduces leakage current, enhances control over the transistor threshold voltage, and provides better power management. By utilizing FD-SOI technology, low power ROs can achieve lower power consumption and improved operational characteristics.

Machine learning-based optimization techniques can be employed to design more efficient ROs. These techniques assist in optimizing circuit parameters such as supply voltage, frequency, and power consumption to achieve optimal performance with minimal power usage. By leveraging machine learning-based optimization, low power ROs can achieve higher levels of efficiency and improved power optimization.

Moreover, advanced control techniques, such as dynamic voltage and frequency scaling (DVFS) and adaptive biasing, can be utilized to optimize the power consumption of ROs based on the operating conditions. These techniques allow for dynamic adjustment of voltage and frequency based on the workload, enabling reduced power consumption without compromising performance. By implementing advanced control techniques, low power ROs can achieve optimal power efficiency in various operating scenarios.

Furthermore, advanced circuit synthesis tools, including automated layout generation and topology exploration, can be employed to design more efficient ROs. These tools assist in optimizing circuit performance while minimizing power consumption. By utilizing advanced circuit synthesis tools, low power ROs can achieve improved circuit efficiency and reduced power consumption.

The inventor devised that these advancements in low power RO technology contribute to the development of energy-efficient and power-optimized electronic devices, addressing the increasing demand for low power consumption in various applications. However, in deep sub-micron processes, ring oscillators with few stages oscillate in high frequency and have high power consumption. It is possible to increase the stage number of the ring oscillator which in turn lower the oscillation frequency, by increasing the signal propagation time and delay cause by the transient responses in the inverters, in which the power consumption cannot be reduced but increased due to more inverters being incorporated in the ring oscillator. Yet in some alternative example circuit topologies, either the power is not very low, or the circuit is very complicated.

With reference to FIG. 1, there is shown an embodiment of an electronic oscillator circuit 100 comprising: a plurality of inverter stages 102 each comprises an inverter 104 and a trans-resistance switch circuit 106 configured to switch on the inverter 104 during an operation of the electronic oscillator circuit 100 thereby facilitating the inverter 104 to generate an inverter output signal in response to an inverter input signal fed to the inverter 104; wherein the inverters 104 in the plurality of the inverter stages 102 are connected to form a ring oscillator circuit.

In this embodiment, the electronic oscillator circuit 100 comprises mainly a ring oscillator including a plurality of inverters 104 connected in series or cascaded configuration, i.e. output of an inverter 104A is connected to the input of the next connected inverter 104B, and in a ring configuration, i.e. the output of the last inverter 104C in the series is connected to the input of the first inverter 104A. As appreciated by a skilled person in the art, the total number of stages may be in any odd number, such that the ring oscillator will operate to provide an oscillating output at the output of the last inverter 104C in the series.

In addition, the electronic oscillator circuit 100 further comprises a trans-resistance switch circuits 106 form by multiple electronic switches 108, such as transistors which may be turned on, and thereby pulling up or down the VDD (or power source) or VSS (or ground) pins to activate each of the inverters 104 in the ring oscillator. Preferably, an inverter output signal is generated only when the inverter 104 is activated. For example, even though a "HI" signal is provided to an input pin of the inverter 104, an output of "LO" signal is only generated when the inverter 104 is activated by pulling up the VDD pin and pulling down the VSS pin of the inverter 104 at the same time, in other words, it may be possible that an output pin of the inverter 104 may be kept at certain state equals to the input pin, e.g. when the output signal of the previous stage changes but the inverter of the current stage has not been activated yet, and accordingly induces a delay for the oscillating signal to propagate.

In addition, in this embodiment, a multiplexer 110, such as a multiple-in-multiple-out multiplexer is included to control individual switches 108 in the trans-resistance switch circuit 106 in each inverter stage 102 in the ring oscillator, thereby controlling the induced delay to "activate" the inverter 104 to generate an output signal for the next inverter stage, in response of a change of HI/LO state at the input pin. For example, the multiplexer 110 may take output signals from the inverters 104 at different stages as multiplexer input signals, and provide corresponding output to selectively switch on or off the switches 108 in the trans-resistance switch circuit 106. Operations of the multiplexer 110 will be further described later in this invention disclosure with reference to FIG. 5.

Continue referring to FIG. 1, in this exemplary embodiment of the oscillator circuit 100, also known as a "Cross Stage Tuned Digitally Controlled Oscillator (CST DCO)", consists of a ring oscillator with cascaded trans-resistance switches (RO with CTRS) and a multiple-in-multiple-out multiplexer. The power source pins and ground pins of the inverters (from INV(1) to INV(m)) in the ring oscillator with cascaded trans-Resistance switches (RO with CTRS) are connected to a group of cascaded trans-resistance switches (CTRS) (from SU(1,1) to SU(m,n) and from SD(1,1) to SD(m,p)).

Preferably, the function of the Trans-Resistance Switches (TRS) is that when closed by the control signal, like normal switch in close state, it conducts well with low resistance, when turned to high impedance state by the control signal, its resistance is high, but much lower than a typical opened switch (e.g., an PMOSFET with its gate tied to high or an NMOSFET with its gate tied to low). The multiple-in-multiple-out multiplexer selects control signals (from U(1,1) to U(m,n) and from D(1,1) to D(m,p)) from the outputs of the inverters (from O(1) to O(m)) according to a group of control word CW[1:k].

During an operation of the oscillator circuit 100, the flip time of inverters (one in INV(1) to INV(m)) in the Ring Oscillator with Cascaded Trans-Resistance Switches (RO with CTRS) are determined by their input signals and the control signals of the Cascaded Trans-Resistance Switches (CTRS) together. The control signals of the Cascaded Trans-Resistance Switches (CTRS) can tune the oscillation frequency of the Ring Oscillator with Cascaded Trans-Resistance Switches (RO with CTRS). Advantageously, due to the configurable switches that actively control the operation time period of the inverters, with lower oscillation frequency, the power consumption is lower.

Preferably, in each of the multiple inverter stages 102 of the Ring Oscillator with Cascaded Trans-Resistance Switches (RO with CTRS), with carefully selected control signals, the 2 CTRS cannot be closed simultaneously, the current path from power source to ground through the inverter's PMOS and NMOS is blocked. Advantageously, this part of power consumption is avoided.

It should be appreciated that the function of the Trans-Resistance Switch (TRS) may be different from a normal switch, e.g. a single MOSFET or a transistor of other types: when closed by the control signal, like normal switch in close state, TRS conducts well with low resistance, when turned to high impedance state by the control signal, its resistance is high, but much lower than a typical opened switch (e.g. an PMOSFET with its gate tied to high or an NMOSFET with its gate tied to low).

The inventor devised that, if normal switch were used, an inverter can have a certain output signal only under 2 conditions: 1. the input signal of the inverter is logic low and all the switches between its VDD pin and the power source (signal name VDD) are closed; and 2. the input signal of the inverter is logic high and all the switches between its VSS pin and the ground (signal name VSS) are closed. Thus, with normal switch, under any other condition except the above 2 conditions, the inverter's output signal will be in the high impedance state (also known as the tri-state or three-state state). Thus, with normal switch, the Cross Stage Tuned Digitally Controlled Oscillator (CST DCO) will fail to oscillate, and therefore Trans-Resistance Switch (TRS) other than normal switch may be more preferred.

With reference to FIG. 1, same as traditional ring oscillators, the oscillator circuit 100 has m (the number m is odd) of inverters INV(1), INV(2), . . . , INV(m) which form a ring. The power source pins and ground pins of the inverters (from INV(1) to INV(m)) are connected to a group/series of the Cascaded Trans-Resistance Switches (CTRS) (from SU(1,1) to SU(m,n) and from SD(1,1) to SD(m,p)). In this example, the multiple-in-multiple-out multiplexer may select control signals (from U(1,1) to U(m,n) and from D(1,1) to D(m,p)) from the outputs of the inverters (from O(1) to O(m)) according to a group of control word CW[1:k].

Preferably, the trans-resistance switch circuit 102 comprises at least one pair of trans-resistance switches 108 arranged to respectively connect the inverter in the same inverter stage to a VDD node and a VSS node of the electronic oscillator circuit 100. Referring to FIGS. 2 and 3, there is shown embodiments of a Trans-Resistance Switch (TRS) 1 and Trans-Resistance Switch (TRS) 2, which may combine to form a pair of trans-resistance switches 108.

Preferably, each of the P-channel transistor 108P and the N-channel transistor 108N are controlled by a trans-resistance switch input signal via a diode circuit 108D, and the diode circuit 108D comprises a first switch 108D-1 and a second switch 108D-2 connected in parallel, wherein the each of the first switch 108D-1 and the second switch 108D-2 includes a diode connected transistor or a diode. Referring to FIG. 2, P1-1 is a PMOS, P1-2 is a diode-connected PMOS, N1-1 is a diode-connected NMOS. Alternatively, P1-2 and N1-1 may be replaced or substituted by a diode or any other types of switches.

In this example, Trans-Resistance Switch (TRS) 1 may be used for the connection from the inverter to the power source in FIG. 1 (via SU(1,1) to SU(m,n)). When the voltage of node A is logic high, and the voltage of node IN is logic low, TRS 1 is closed, the resistance between node A and node B is low. When the voltage of node A is logic high, in a short duration after the voltage of node IN rises from logic low to logic high, TRS 1 is in high impedance mode, the resistance between node A and node B is high, but still much lower than a typical opened switch. In this RO with CTRS application, the voltage of node IN will not be kept in logic high for long, TRS 1 is either closed or in high impedance mode, as required by TRS' definition.

Referring to FIG. 3, N2-1 is a NMOS, P2-1 is a diode-connected PMOS (can be substituted by a diode), N2-2 is a diode-connected NMOS (can be substituted by a diode). It should be appreciated by a skilled person that the diode circuit 108D comprising a first switch 108D-1 and a second switch 108D-2 connected in parallel, may be differently implemented in other designs or circuit topologies.

In this embodiment, Trans-Resistance Switch (TRS) 2 is suitable for the connecting the inverter to ground in FIG. 1 (via SD(1,1) to SD(m,p)). When the voltage of node B is logic low, and the voltage of node IN is logic high, TRS 2 is closed, the resistance between node A and node B is low. When the voltage of node B is logic low, in a short duration after the voltage of node IN falls from logic high to logic low, TRS 2 is in high impedance mode, the resistance between node A and node B is high, but still much lower than a typical opened switch. In this RO with CTRS application, the voltage of node IN will not be kept in logic low for long, TRS 2 is either closed or in high impedance mode, as required by TRS' definition.

Figure 4:
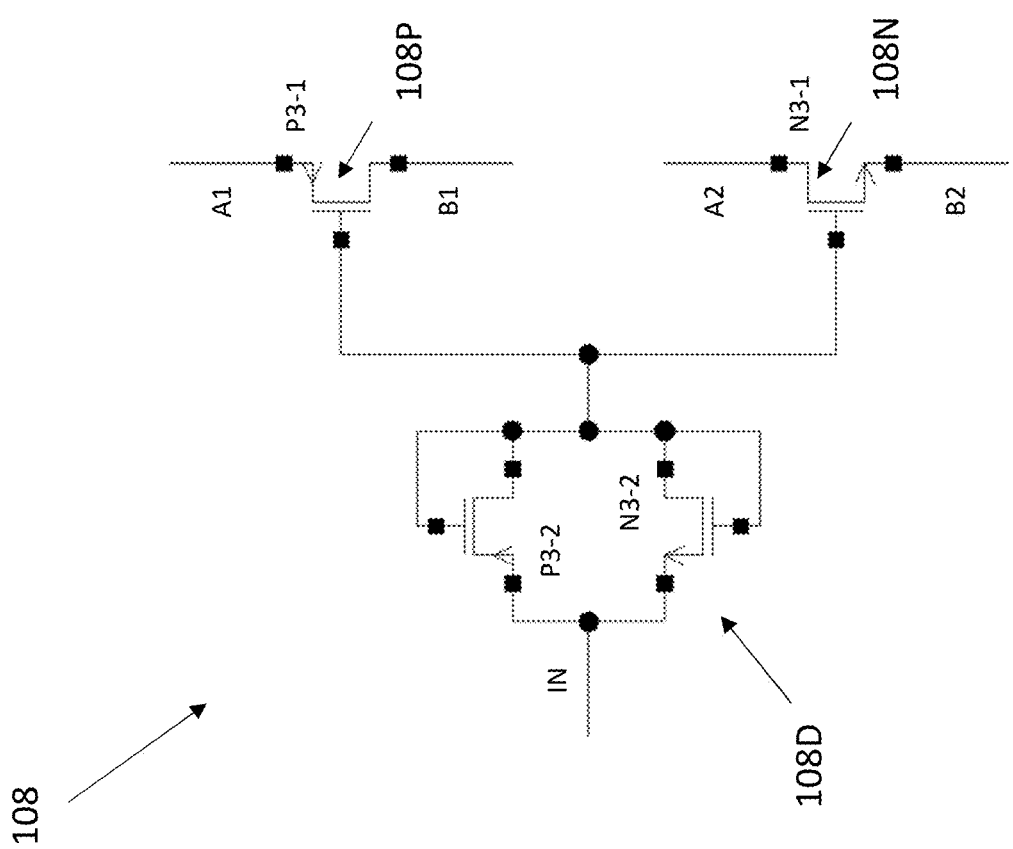
FIG. 4 is a schematic diagram showing a trans-resistance switch pair in an inverter stage of the electronic oscillator circuit in accordance with an embodiment of the present invention.

In an alternative embodiment of TRS, referring to FIG. 4, the P-channel transistor 108P and the N-channel transistor 108N (of a TRS pair) may share a common trans-resistance switch input signal via the diode circuit 108D. For example, a Trans-Resistance Switch (TRS) in a Cascaded Trans-Resistance Switch (CTRS) connected to power source and a Trans-Resistance Switch (TRS) in a Cascaded Trans-Resistance Switch (CTRS) connected to ground can be combined to a Trans-Resistance Switch (TRS) Pair with common control input.

Although any two TRS can be selected to combine, it is preferable that the two TRS are from a same stage, e.g., SU(1,1) and SD(1,1), or SU(1,1) and SD(1,p), etc. Preferably, the diode network 108D, i.e. the diode-connected PMOS and NMOS, may be similar in TRS 1 and TRS 2, thus a pair of TRS 1 and TRS 2 with a same control signal can be simplified as shown in FIG. 4.

In this example, P3-1 is a PMOS, N2-1 is a NMOS, P3-2 is a diode-connected PMOS, N3-2 is a diode-connected NMOS, where one or both of P3-2 and N3-2 can be substituted by a diode similar to the previous examples. The function of node IN, A1, B1 is exactly same as node IN, A, B in TRS 1 in FIG. 2, and the function of node IN, A2, B2 is exactly same as node IN, A, B in TRS 2 in FIG. 3, as earlier described in this invention disclosure.

In an alternative example, more TRS may be combine to share the same input via a single diode circuit, e.g. a single diode circuit formed by P3-2 and N3-2 may be used to simultaneously turn on two (or any even number x of) P-channel transistors and two (i.e. the same even number x) N-channel transistors in two different inverter stages, to reduce the total number of switches being incorporated in an oscillator circuit.

Figure 5:
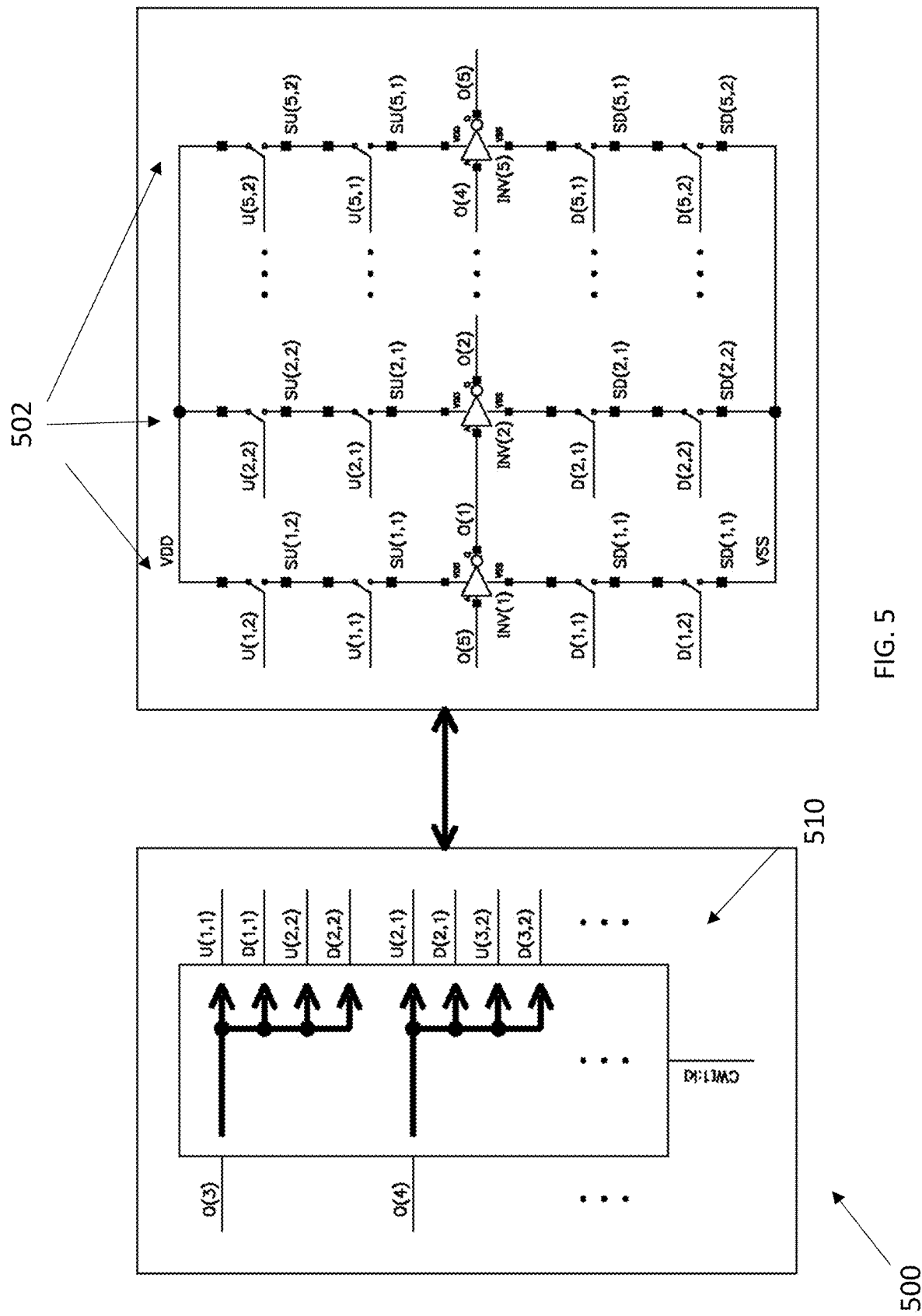
FIG. 5 is schematic diagram showing an electronic oscillator circuit in accordance with an embodiment of the present invention, where the electronic oscillator circuit comprises 5 inverter stages and each inverter stage includes 2 pairs of cascaded trans-resistance switches.

With reference to FIG. 5, there is shown an exemplary embodiment of the electronic oscillator circuit 500, where the stage number of the Ring Oscillator with Cascaded Trans-Resistance Switches (RO with CTRS) is 5 and the number of TRS in each Cascaded Trans-Resistance Switches (CTRS) is 2, i.e. 5 inverters connected in ring shape configuration with 2 pairs of TRS per inverter stage connected the respective inverter to the power source and the ground. In this example, O(5) may be assigned as an output of the ring oscillator or the oscillator circuit 500.

In an example operation, the electronic oscillator circuit 500 further comprises a multiplexer 510, preferably a multiple-in-multiple-out multiplexer, arranged to output a control signal for each of the first set of trans-resistance switches and the second set of trans-resistance switches corresponding to the inverter output signal at each plurality of inverter stages 502 being provided to the multiplexer as multiplexer input signals, which may be generated further based on a group of control word being inputted to the multiple-in-multiple-out multiplexer. For example, each of the first set of switches and the second set of switches includes 2 TRS connected in series at the VDD/VSS pins to the power source/ground of the circuit 500. The multiple-in-multiple-out multiplexer 510 may select control signals (from U(1,1) to U(5,2) and from D(1,1) to D(5,2)) from the outputs of the inverters (from O(1) to O(5)) according to a group of control word CW[1:20]. Each control signal is selected from the 5 outputs of the inverters by one control word, accordingly, an oscillator frequency of the ring oscillator may be tuned by modifying the group of control word.

In one example operation, the multiplexer forwards the inverter output signal of a predetermined stage in the ring oscillator circuit to control a plurality pairs of cascaded trans-resistance switches in one or more previous inverter stages in the ring oscillator circuit. For example, when according values are written into the group of control word CW[1:k], O(3) is selected as control signal U(1,1), D(1,1), U(2,2), D(2,2), O(4) is selected as control signal U(2,1), D(2,1), U(3,2), D(3,2), O(5) is selected as control signal U(3,1), D(3,1), U(4,2), D(4,2), O(1) is selected as control signal U(4,1), D(4,1), U(5,2), D(5,2), O(2) is selected as control signal U(5,1), D(5,1), U(1,2), D(1,2). When other values, e.g. control signals for other switches based on inverter output signals O(1), O(2), O(3), O(4) and O(5), are written into the group of control word CW [1:20], the control signals are changed, thus the parameters of the CST DCO such as frequency may be tuned. In some alternative examples, other input may be processed by the multiplexer so as to increase or decrease the oscillating frequency of the RO.

Figure 6:
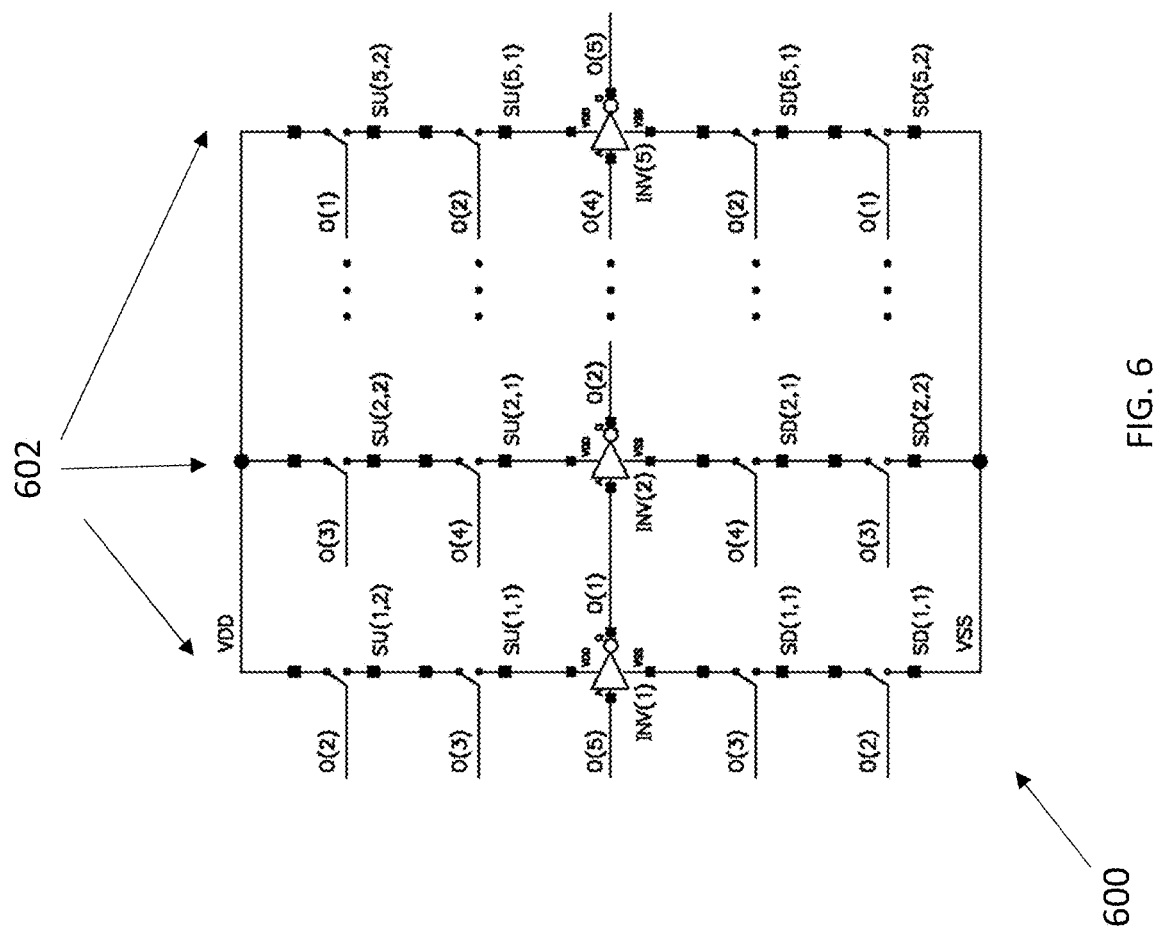
FIG. 6 schematic diagram showing an electronic oscillator circuit in accordance with an alternative embodiment of the present invention, where the electronic oscillator circuit comprises 5 inverter stages and each inverter stage includes 2 pairs of cascaded trans-resistance switches, without a multiplexer being used for controlling the operations of the cascaded trans-resistance switches.

With reference to FIG. 6, there in shown an alternative embodiment of the oscillator circuit 600, in which the inverter output signal of each of a plurality of inverter stages 602 are provided as a control signal for each of the first set of trans-resistance switches and the second set of trans-resistance switches in one or more of previous stages in the ring oscillator circuit. In this example, the stage number of the Ring Oscillator with Cascaded Trans-Resistance Switches (RO with CTRS) is 5 and the number of TRS in each Cascaded Trans-Resistance Switches (CTRS) is 2, similar to the previous example embodiment 500. It should be noted that other numbers of inverter stages may be included in the ring oscillator circuit, as long as the number of inverters is an odd number m.

However, a Multiple-in-multiple-out Multiplexer is not used along with of the Ring Oscillator with Cascaded Trans-Resistance Switches (RO with CTRS), instead the control signal is provided to pairs of trans-resistance switches in a number of previous stages matching with the number of pairs of trans-resistance switches in each inverter stage. The control signals are selected from the outputs of the inverters (from O(1) to O(5)), but without the Multiple-in-multiple-out Multiplexer, the control signals are fixed.

For example, Trans-Resistance Switch (TRS) 1 in FIG. 2 and Trans-Resistance Switch (TRS) 2 in FIG. 3 may be employed as Trans-Resistance Switch (TRS) in each of the inverter stages 602 in the oscillator circuit 600, or a pair of TRS 1 and TRS 2 with same sequence number (e.g., SU(1,1) and SD(1,1)) are combined to a Trans-Resistance Switch (TRS) Pair, and the TRS Pair can be furtherly simplified to example circuit with reference to FIG. 4.

In addition, the number of TRS in each Cascaded Trans-Resistance Switches (CTRS) may not necessary be 2 but other integer, depending on the delay needs to be included to turn on the associated inverter in the circuit.

Advantageously, comparing to its counterpart in the form of traditional ring oscillator while with the same inverters, this Ring Oscillator with Cascaded Trans-Resistance Switches (RO with CTRS) has a much lower frequency and consumes a much lower power consumption.

These embodiments may be advantageous in that, a novel Cross Stage Tune (CST) method may be employed to provide a Cross Stage Tuned Digitally Controlled Oscillator (CST DCO) which may be manipulated for different frequency applications. The Cross Stage Tuned Digitally Controlled Oscillator (CST DCO) consists of a Ring Oscillator with Cascaded Trans-Resistance Switches (RO with CTRS), and operation parameters of the CST DCO may be adjusted by controlling the trans-resistance switches precisely.

Advantageously. the Cross Stage Tuned Digitally Controlled Oscillator (CST DCO) may significantly reduce the power consumption by a novel Cascaded Trans-Resistance Switches (CTRS) structure and a novel Cross Stage Tune (CST) method, thereby increasing the inverters' propagation delay, and preventing the inverters' PMOSFETs and NMOSFETs to conduct simultaneously and conduct a large current from power source to ground during the inventors' flip.

Due to low power consumption, the oscillators in accordance with embodiments of the present invention may be used in various battery-powered devices and low-power applications, where minimizing power consumption is critical to extending battery life or reducing energy costs, such as but not limited to:

Clock generation: Low power oscillators can be used to generate clock signals in digital circuits, providing timing and synchronization signals for microprocessors, memory devices, and other digital components;

Wireless communication: Low power oscillators can be used in wireless communication systems, such as Bluetooth or Wi-Fi, to generate carrier signals for transmitting data over the air;

Sensor applications: Low power oscillators can be used in sensor circuits to provide timing signals for measuring physical phenomena such as temperature, pressure, or light; and Power management: Low power oscillators can be used in power management circuits to control the operation of power switches or other components, helping to reduce power consumption and extend battery life.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present invention are either wholly implemented by computing system or partly implemented by computing systems then any appropriate computing system architecture may be utilised. This will include tablet computers, wearable devices, smart phones, Internet of Things (IoT) devices, edge computing devices, stand alone computers, network computers, cloud-based computing devices and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. An electronic oscillator circuit comprising: a plurality of inverter stages each comprises an inverter and a trans-resistance switch circuit configured to switch on the inverter during an operation of the electronic oscillator circuit thereby facilitating the inverter to generate an inverter output signal in response to an inverter input signal fed to the inverter; wherein the inverters in the plurality of the inverter stages are connected to form a ring oscillator circuit;

wherein the trans-resistance switch circuit comprises at least one pair of trans-resistance switches arranged to respectively connect the inverter in the same inverter stage to a VDD node and a VSS node of the electronic oscillator circuit;

wherein the inverter in each of the inverter stage is switched on only when the inverter is electrically connected to the VDD node and the VSS node via a complete circuit path formed by the trans-resistance switch circuit; and wherein the trans-resistance switch circuit comprises a plurality of pairs of cascaded trans-resistance switches, including a first set of trans-resistance switches connected in series between the inverter and the VDD node, and a second set of trans-resistance switches connected in series between the inverter and the VSS node.

2. The electronic oscillator circuit in accordance with claim 1, wherein each of the at least one pair of trans-resistance switches comprises a P-channel transistor arranged to connect the inverter to the VDD node and an N-channel transistor arranged to connected the inverter to the VSS node.

3. The electronic oscillator circuit in accordance with claim 1, further comprising a multiplexer arranged to output a control signal for each of the first set of trans-resistance switches and the second set of trans-resistance switches corresponding to the inverter output signal at each plurality of inverter stages being provided to the multiplexer as multiplexer input signals.

4. The electronic oscillator circuit in accordance with claim 3, wherein the multiplexer is a multiple-in-multiple-out multiplexer.

5. The electronic oscillator circuit in accordance with claim 4, wherein the control signal is generated further based on a group of control word being inputted to the multiple-in-multiple-out multiplexer.

6. The electronic oscillator circuit in accordance with claim 5, wherein an oscillator frequency of the ring oscillator is tuned by modifying the group of control word.

7. The electronic oscillator circuit in accordance with claim 6, wherein the multiplexer is arranged to forward the inverter output signal of a predetermined stage in the ring oscillator circuit to control a plurality pairs of cascaded trans-resistance switches in one or more previous inverter stages in the ring oscillator circuit.

8. The electronic oscillator circuit in accordance with claim 1, wherein the inverter output signal of each of a plurality of inverter stages are provided as a control signal for each of the first set of trans-resistance switches and the second set of trans-resistance switches in one or more of previous stages in the ring oscillator circuit.

9. The electronic oscillator circuit in accordance with claim 8, wherein the control signal is provided to pairs of trans-resistance switches in a number of previous stages matching with the number of pairs of trans-resistance switches in each inverter stage.

10. An electronic oscillator circuit comprising: a plurality of inverter stages each comprises an inverter and a trans-resistance switch circuit configured to switch on the inverter during an operation of the electronic oscillator circuit thereby facilitating the inverter to generate an inverter output signal in response to an inverter input signal fed to the inverter; wherein the inverters in the plurality of the inverter stages are connected to form a ring oscillator circuit;

wherein the trans-resistance switch circuit comprises at least one pair of trans-resistance switches arranged to respectively connect the inverter in the same inverter stage to a VDD node and a VSS node of the electronic oscillator circuit;

wherein each of the at least one pair of trans-resistance switches comprises a P-channel transistor arranged to connect the inverter to the VDD node and an N-channel transistor arranged to connected the inverter to the VSS node; and wherein each of the P-channel transistor and the N-channel transistor are controlled by a trans-resistance switch input signal via a diode circuit.

11. The electronic oscillator circuit in accordance with claim 10, wherein the diode circuit comprises a first switch and a second switch connected in parallel, wherein the each of the first switch and the second switch includes a diode connected transistor or a diode.

12. The electronic oscillator circuit in accordance with claim 10, wherein each of the P-channel transistor and the N-channel transistor share a common trans-resistance switch input signal via the diode circuit.

13. A method for controlling an oscillation frequency of a ring oscillator circuit, comprising the step of:

providing a plurality of inverter stages each comprises an inverter and a trans-resistance switch circuit configured to switch on the inverter during an operation of the ring oscillator circuit; and facilitating the inverter to generate an inverter output signal in response to an inverter input signal fed to the inverter;

wherein the trans-resistance switch circuit comprises at least one pair of trans-resistance switches arranged to respectively connect the inverter in the same inverter stage to a VDD node and a VSS node of the ring oscillator circuit;

wherein the inverter in each of the inverter stage is switched on only when the inverter is electrically connected to the VDD node and the VSS node via a complete circuit path formed by the trans-resistance switch circuit; and wherein the trans-resistance switch circuit comprises a plurality of pairs of cascaded trans-resistance switches, including a first set of trans-resistance switches connected in series between the inverter and the VDD node, and a second set of trans-resistance switches connected in series between the inverter and the VSS node.

14. The method in accordance with claim 13, further comprising the step of providing a multiplexer arranged to output a control signal for each of the first set of trans-resistance switches and the second set of trans-resistance switches corresponding to the inverter output signal at each plurality of inverter stages being provided to the multiplexer as multiplexer input signals.

* * * * *